(12) United States Patent
Old et al.

(10) Patent No.: US 10,484,021 B1
(45) Date of Patent: Nov. 19, 2019

(54) LOG-LIKELIHOOD RATIO PROCESSING FOR LINEAR BLOCK CODE DECODING

(71) Applicant: Xilinx, Inc., San Jose, CA (US)

(72) Inventors: Gordon I. Old, Edinburgh (GB); Richard L. Walke, Edinburgh (GB)

(73) Assignee: XILINX, INC., San Jose, CA (US)

( * ) Notice: Subject to any disclaimer, the term of this patent is extended or adjusted under 35 U.S.C. 154(b) by 71 days.

(21) Appl. No.: 15/916,090

(22) Filed: Mar. 8, 2018

(51) Int. Cl.
*H03M 13/45* (2006.01)
*H03M 13/00* (2006.01)

(52) U.S. Cl.
CPC .......... *H03M 13/45* (2013.01); *H03M 13/615* (2013.01)

(58) Field of Classification Search
CPC . H03M 13/45; H03M 13/615; H03M 13/6575
See application file for complete search history.

(56) References Cited

U.S. PATENT DOCUMENTS

| | | | | |
|---|---|---|---|---|
| 6,473,529 | B1 * | 10/2002 | Lin ......................... | G06F 7/544 382/232 |
| 9,176,928 | B2 * | 11/2015 | DeLaquil ................ | G06F 17/12 |
| 2013/0117344 | A1 * | 5/2013 | Gross ...................... | G06F 17/10 708/490 |
| 2018/0329706 | A1 * | 11/2018 | Langhammer ............ | G06F 7/38 |

OTHER PUBLICATIONS

Leroux, Camile et al., "A Semi-Parallel Successive-Cancellation Decoder for Polar Codes" IEEE Transactions on Signal Processing, vol. 61, No. 2, Jan. 15, 2013.

* cited by examiner

*Primary Examiner* — Kyle Vallecillo
(74) *Attorney, Agent, or Firm* — W. Eric Webostad

(57) ABSTRACT

Apparatuses and methods relating generally to a decoder. In an apparatus, a control circuit receives first-third sign signals, a partial sum signal, a function select signal, and a carry signal as an input vector to provide an output sign and a vector select. A select generation circuit receives the first and second sign signals and the partial sum signal to provide an add/subtract select signal. A subtractor subtracts from a first absolute value signal a second absolute value signal to provide the third sign signal and a difference signal. Responsive to the add/subtract select signal, an adder/subtractor either adds or subtracts the first absolute value signal to or from the second absolute value signal to provide the carry signal and a sum/difference signal. A multiplexer selects from the first and second absolute value signals, the difference signal, and the sum/difference signal a selected value signal responsive to the vector select.

13 Claims, 10 Drawing Sheets

```
module polar_v1_0_pu
#( parameterinteger LLR_WIDTH = 8)
(
input logic clk,
input logic reset_n,
input logic [LLR_WIDTH-1:0] a,
input logic [LLR_WIDTH-1:0] b,
input logic fg_sel,
input logic psum,
output logic [LLR_WIDTH-1:0] llr_out
);
typedef logic signed [LLR_WIDTH-1:0] signed_ext_abs; //captures sign change (one bit wider than abs part of LLR).
typedef logic unsigned [LLR_WIDTH-1:0] unsigned_ext_abs; //captures overflow (one bit wider than abs part of LLR).
typedef logic unsigned [LLR_WIDTH-2:0] unsigned_abs; // abs part of LLR.

localparam unsigned_abs MAXLLR = 2**(LLR_WIDTH-1)-1;

unsigned_abs absa;
unsigned_abs absb;
logic sgna;
logic sgnb;
logic sgnout_d;
unsigned_abs absout_d;
logic sgnout_q;
unsigned_abs absout_q;
logic unsigned [1:0] abssel;

unsigned_ext_abs a_or_a_p_b;   //abs a or abs a plus abs b
signed_ext_abs a_m_b;          //abs a minus abs b. This provides the sign for a>b comparisons.
signed_ext_abs b_or_b_m_a;     //abs b or abs b minus a.

logic a_gtr_b;
logic spill;
logic [5:0] ctrl_cat;
logic [1:0] sgn_mux_sel;
unsigned_abs absout_alt;
logic sgnout_alt;

//Deconcatenate input LLRs into sign and magnitude components.
assign {sgna,absa} = a;
assign {sgnb,absb} = b;
assign a_or_a_p_b = unsigned_ext_abs'(absa) + (fg_sel ? unsigned_ext_abs'(absb) : 0);
assign a_m_b = signed_ext_abs'(absa) - signed_ext_abs'(absb);
assign b_or_b_m_a = signed_ext_abs'(absb) - (fg_sel ? signed_ext_abs'(absa) : 0);
assign spill = a_or_a_p_b[LLR_WIDTH-1];
assign a_gtr_b = !a_m_b[LLR_WIDTH-1];

//4 input mux selects between a+b, a-b, b-a and max.
//Select to 4 input mux is function of sgna, sgnb, psum, fg_sel, a>b and a+b spill.
//4 input select inputs are:
//00: a+b 01: a-b, 10: b-a, 11: max
assign ctrl_cat = {fg_sel, psum, sgna, sgnb, a_gtr_b, spill};
always_comb begin : PU_ALT_COMB
  case (ctrl_cat)
```

(c) 2017-18 Xilinx Incorporated

FIG. 5-1

```
//Start of F fn
6'b000000 : sgn_mux_sel = 2'b00; //A
6'b000001 : sgn_mux_sel = 2'b00;
6'b000010 : sgn_mux_sel = 2'b10; //B
6'b000011 : sgn_mux_sel = 2'b10;
6'b000100 : sgn_mux_sel = 2'b00;
6'b000101 : sgn_mux_sel = 2'b00;
6'b000110 : sgn_mux_sel = 2'b10;
6'b000111 : sgn_mux_sel = 2'b10;
6'b001000 : sgn_mux_sel = 2'b00;
6'b001001 : sgn_mux_sel = 2'b00;
6'b001010 : sgn_mux_sel = 2'b10;
6'b001011 : sgn_mux_sel = 2'b10;
6'b001100 : sgn_mux_sel = 2'b00;
6'b001101 : sgn_mux_sel = 2'b00;
6'b001110 : sgn_mux_sel = 2'b10;
6'b001111 : sgn_mux_sel = 2'b10;
6'b010000 : sgn_mux_sel = 2'b00;
6'b010001 : sgn_mux_sel = 2'b00;
6'b010010 : sgn_mux_sel = 2'b10;
6'b010011 : sgn_mux_sel = 2'b10;
6'b010100 : sgn_mux_sel = 2'b00;
6'b010101 : sgn_mux_sel = 2'b00;
6'b010110 : sgn_mux_sel = 2'b10;
6'b010111 : sgn_mux_sel = 2'b10;
6'b011000 : sgn_mux_sel = 2'b00;
6'b011001 : sgn_mux_sel = 2'b00;
6'b011010 : sgn_mux_sel = 2'b10;
6'b011011 : sgn_mux_sel = 2'b10;
6'b011100 : sgn_mux_sel = 2'b00;
6'b011101 : sgn_mux_sel = 2'b00;
6'b011110 : sgn_mux_sel = 2'b10;
6'b011111 : sgn_mux_sel = 2'b10;
```

} 506

(c) 2017-18 Xilinx Incorporated

FIG. 5-2

```
//start of G fn
// ctrl_cat = {fg_sel, psum, sgna, sgnb, a_gtr_b, spill};
6'b100000 : sgn_mux_sel = 2'b00; //A+B
6'b100001 : sgn_mux_sel = 2'b11; //A+B saturating
6'b100010 : sgn_mux_sel = 2'b00; //A+B
6'b100011 : sgn_mux_sel = 2'b11; //A+B saturating
6'b100100 : sgn_mux_sel = 2'b10; //B-A
6'b100101 : sgn_mux_sel = 2'b10; //impossible
6'b100110 : sgn_mux_sel = 2'b01; //A-B
6'b100111 : sgn_mux_sel = 2'b01; //impossible
6'b101000 : sgn_mux_sel = 2'b10; //B-A
6'b101001 : sgn_mux_sel = 2'b10; //impossible
6'b101010 : sgn_mux_sel = 2'b01; //A-B
6'b101011 : sgn_mux_sel = 2'b01; //impossible
6'b101100 : sgn_mux_sel = 2'b00; //A+B
6'b101101 : sgn_mux_sel = 2'b11; //A+B saturating
6'b101110 : sgn_mux_sel = 2'b00; //A+B
6'b101111 : sgn_mux_sel = 2'b11; //A+B saturating
6'b110000 : sgn_mux_sel = 2'b10; //B-A
6'b110001 : sgn_mux_sel = 2'b10; //impossible
6'b110010 : sgn_mux_sel = 2'b01; //A-B
6'b110011 : sgn_mux_sel = 2'b01; //impossible
6'b110100 : sgn_mux_sel = 2'b00; //A+B
6'b110101 : sgn_mux_sel = 2'b11; //A+B saturating
6'b110110 : sgn_mux_sel = 2'b00; //A+B
6'b110111 : sgn_mux_sel = 2'b11; //A+B saturating
6'b111000 : sgn_mux_sel = 2'b00; //A+B
6'b111001 : sgn_mux_sel = 2'b11; //A+B saturating
6'b111010 : sgn_mux_sel = 2'b00; //A+B
6'b111011 : sgn_mux_sel = 2'b11; //A+B saturating
6'b111100 : sgn_mux_sel = 2'b10; //B-A
6'b111101 : sgn_mux_sel = 2'b10; //impossible
6'b111110 : sgn_mux_sel = 2'b01; //A-B
6'b111111 : sgn_mux_sel = 2'b01; //impossible
endcase // case (ctrl_cat)
```

(c) 2017-18 Xilinx Incorporated

FIG. 5-3

```
case(sgn_mux_sel)
  2'b00: absout_alt = a_or_a_p_b[LLR_WIDTH-2:0];
  2'b01: absout_alt = a_m_b[LLR_WIDTH-2:0];
  2'b10: absout_alt = b_or_b_m_a[LLR_WIDTH-2:0];
  2'b11: absout_alt = MAXLLR;
endcase // case (sgn_mux_sel)

if (fg_sel == 0) begin //F
  sgnout_alt = sgna ^ sgnb;
end else begin
  if (psum == 0) begin
    sgnout_alt = a_gtr_b ? sgna : sgnb;
  end else begin
    sgnout_alt = a_gtr_b ? !sgna : sgnb;
  end
end
end : PU_ALT_COMB assign absout_d = absout_alt;
assign sgnout_d = sgnout_alt;

always_ff @(posedge clk) begin: FF_OUT
  if (!reset_n) begin
    absout_q <= '{default:0};
    sgnout_q <= 1'b0;
  end else begin
    absout_q <= absout_d;
    sgnout_q <= sgnout_d;
  end
end: FF_OUT assign llr_out = {sgnout_q,absout_q}; //concatenate sign to abs value
end module
```

} 508

(c) 2017-18 Xilinx Incorporated

FIG. 5-4

```
unsigned_ext_abs      b_m_or_p_a;    //abs a minus or plus abs b
signed_ext_abs        a_m_b;         //abs a minus abs b. This provides the sign for a>b comparisons.

logic                 m_or_p;
logic                 a_gtr_b;
logic                 spill;

logic unsigned [LLR_WIDTH-1-1:0]    absout_alt;
logic                               sgnout_alt;

assign m_or_p     = sgna ^ sgnb ^ psum;
assign a_m_b      = signed_ext_abs'(absa) - signed_ext_abs'(absb);
assign b_m_or_p_a = signed_ext_abs'(absb) + (m_or_p ? ~signed_ext_abs'(absa) : signed_ext_abs'(absa)) + m_or_p;

// if adding then we must select adder output, and overflow is possible
assign spill      = m_or_p | !fg_sel ? 1'b0 : b_m_or_p_a[LLR_WIDTH-1];
assign a_gtr_b    = m_or_p | !fg_sel ? !a_m_b[LLR_WIDTH-1] : 1'b0;

always_comb begin : PU_ALT_COMB
  case({fg_sel,a_gtr_b})
    2'b00: absout_alt = absa;
    2'b01: absout_alt = absb;
    2'b10: absout_alt = b_m_or_p_a[LLR_WIDTH-2:0];
    2'b11: absout_alt = a_m_b[LLR_WIDTH-2:0];
  endcase if (fg_sel == 0) begin //F
    sgnout_alt = sgna ^ sgnb;
  end else begin
    if (psum == 0) begin
      sgnout_alt = a_gtr_b ? sgna : sgnb;
    end else begin
      sgnout_alt = a_gtr_b ? !sgna : sgnb;
    end
  end
end : PU_ALT_COMB assign absout_d = spill ? MAXLLR[LLR_WIDTH-2:0] : absout_alt;
assign sgnout_d = sgnout_alt;

always_ff @(posedge clk) begin: FF_OUT
  absout_q  <= absout_d;
  sgnout_q  <= sgnout_d;
end: FF_OUT assign llr_out = {sgnout_q,absout_q};    //concatenate sign to abs value endmodule
```

(c) 2017-18 Xilinx Incorporated

FIG. 5-5

LOG-LIKELIHOOD RATIO PROCESSING FOR LINEAR BLOCK CODE DECODING

FIELD OF THE INVENTION

The following description relates to integrated circuit devices ("ICs"). More particularly, the following description relates to log-likelihood ratio processing for linear block code decoding for an IC.

BACKGROUND

Polar codes are linear block codes, which may be used as Forward Error Correction ("FEC") codes. Polar codes may have items in common with other linear block codes, such as Turbo codes or Low Density Parity Check ("LDPC") codes. A polar encoded codeword may be decoded with what is known as Successive Cancellation ("SC"). An enhancement to SC decoding is Successive Cancellation List ("SCL") decoding.

SUMMARY

An apparatus relates generally to a decoder. In such an apparatus, a control circuit is configured to receive a first sign signal, a second sign signal, a partial sum signal, a function select signal, a third sign signal, and a carry signal as an input vector to provide an output sign signal and a vector select signal. A select generation circuit is configured to receive the first sign signal, the second sign signal, and the partial sum signal to provide an add/subtract select signal. A subtractor is configured to subtract from a first absolute value signal a second absolute value signal to provide the third sign signal and a difference signal. Responsive to the add/subtract select signal, an adder/subtractor is configured to either add or subtract the first absolute value signal to or from the second absolute value signal to provide the carry signal and a sum/difference signal. A multiplexer is configured to select from the first absolute value signal, the second absolute value signal, the difference signal, and the sum/difference signal a selected value signal responsive to the vector select signal.

Another apparatus relates generally to a decoder. In such an apparatus, a control circuit is configured to receive a first sign signal, a second sign signal, a partial sum signal, a function select signal, a third sign signal, and a carry signal as an input vector to provide an output sign signal and a vector select signal. A first subtractor is configured to subtract from a first absolute value signal a second absolute value signal to provide the third sign signal and a first difference signal. A first multiplexer is configured to select from a fixed masking signal and the second absolute value signal a first output responsive to the function select signal. A second multiplexer is configured to select from the fixed masking signal and the first absolute value signal a second output responsive to the function select signal. An adder is configured to add the first output to the first absolute value signal to provide the carry signal and a sum signal. A second subtractor is configured to subtract the second output from the second absolute value signal to provide a second difference signal. A third multiplexer is configured to select from a maximum signal, the first difference signal, the second difference signal, and the sum signal an output absolute value signal responsive to the vector select signal.

A method relates generally to decoding. In such a method, a decoder receives a first sign signal, a second sign signal, a partial sum signal, a function select signal, a third sign signal, and a carry signal as an input vector to a control circuit thereof and a first absolute value signal and a second absolute value signal. An output sign signal and a vector select signal are looked up in a lookup table circuit of the control circuit in response to the input vector. A select generation circuit generates an add/subtract select signal in response to the first sign signal, the second sign signal, and the partial sum signal. A subtractor subtracts from the first absolute value signal the second absolute value signal to provide the third sign signal and a difference signal. Responsive to the add/subtract select signal, selectively either adding to or subtracting from the first absolute value signal is the second absolute value signal by an adder/subtractor to provide the carry signal and a sum/difference signal. A multiplexer selects from the first absolute value signal, the second absolute value signal, the difference signal, and the sum/difference signal a selected value signal responsive to the vector select signal.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 2-1 is a block diagram depicting an exemplary output vector generator.

FIG. 2-2 is a block-circuit diagram depicting an exemplary lookup table circuit.

FIGS. 5-1 through 5-4 is a pseudocode listing depicting an exemplary decoder node listing for the decoder node of FIG. 1.

FIG. 5-5 is a pseudocode listing depicting an exemplary decoder node listing for the decoder node of FIG. 3.

DETAILED DESCRIPTION

Figure 1:
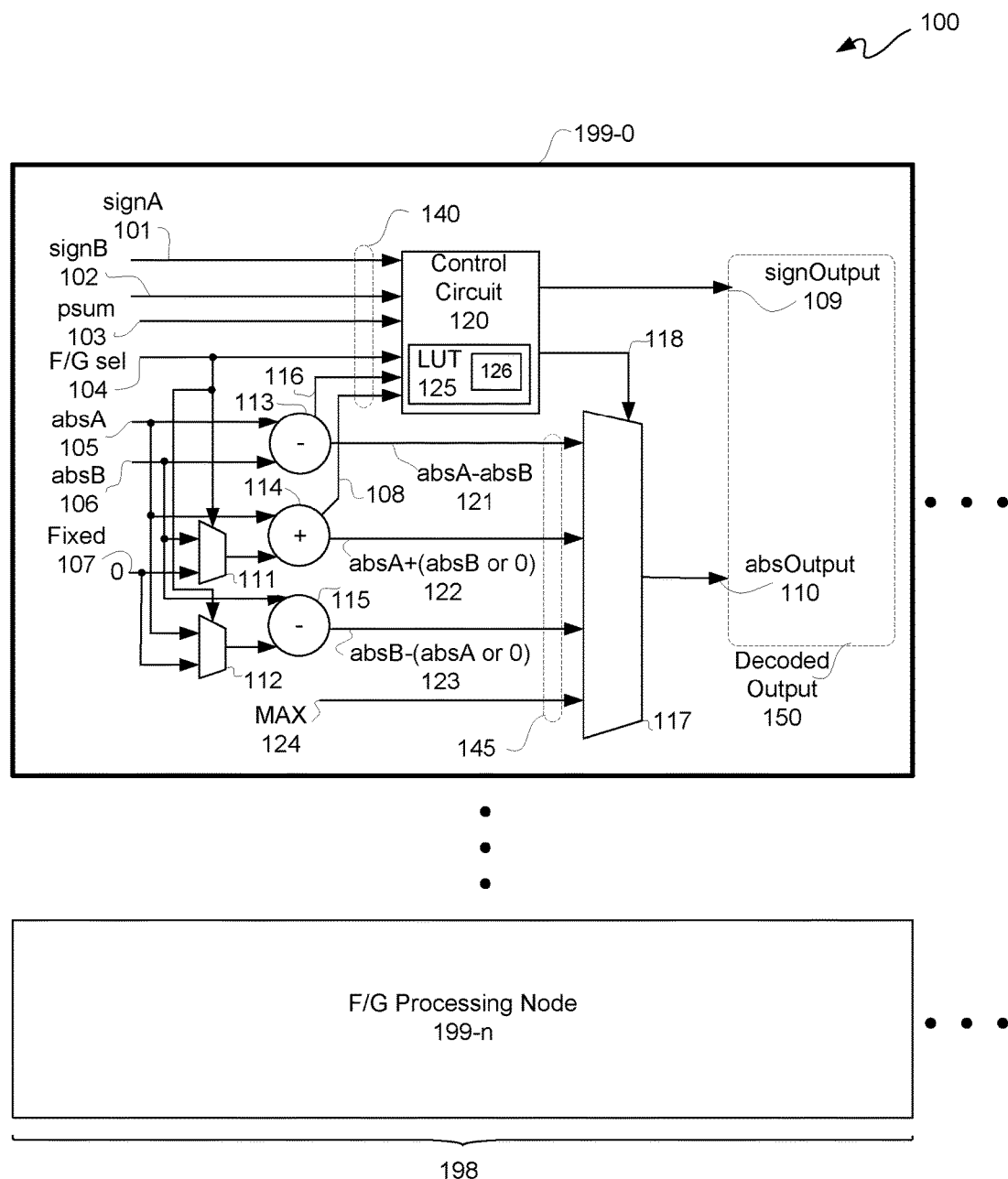
FIG. 1 is a circuit-block diagram depicting an exemplary decoder.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

In polar code encoding ("polar encoding"), a trellis of exclusive-OR ("XOR") operations may be used to encode a codeword, such as for transmission via a communication channel or channels to a receiver having a decoder. While an "atomic unit" for encoding may be an XOR circuit, an atomic unit for polar decoding of a received codeword is one of two functions, namely an "F" function or a "G" function as is known. The terms "F" function and "G" function are the names given in the art of polar coding.

In polar code decoding ("polar decoding"), whether an F function or a G function is performed in a decoding cycle for a location in a decoding trellis depends on an index of a bit of a codeword being decoded in such decoding cycle. An F function uses two log-likelihood ratio ("LLR") values, such as operands A and B, from a rank of a decoding trellis and outputs an LLR value for an immediately next rank of such a decoding trellis. Similarly, a G function uses two LLR values, also such as operands A and B, from a rank of a decoding trellis and outputs an LLR value for an immediately next rank of such a decoding trellis. However, a G function additionally uses an input bit known as a partial sum ("psum"). Such a partial sum bit for polar decoding may be derived from previously decoded bits of a codeword, as is known.

As described herein, an F function and a G function, which share some common internal operations, may be combined into a single decoder processing unit configured to select either an F function or a G function for processing input operands. A polar code decoder generally includes more than one decoder processing unit, and may include hundreds of decoder processing units. Along those lines, an F/G function select signal may be used to put each such a decoder processing unit into either an F function processing mode or a G function processing mode. As described hereinbelow, a control circuit may be configured to determine LLR values for successive cancellation polar code decoding for both an F function or a G function, depending on which is selected.

LLR A and LLR B values may be denoted respectively as $\lambda_A = \log(A)$ and $\lambda_B = \log(B)$. In an LLR domain, F and G functions for successive cancellation polar decoding may be determined using hyperbolic functions such as in a sum-product algorithm ("SPA"); however, such F and G functions may be approximated using a minimum ("min") function using min-sum ("MS") equations. An F function may be approximated as a min-sum as set forth in Equation (1) as:

$$\lambda_F(\lambda_A, \lambda_B) \approx \psi^*(\lambda_A)\psi^*(\lambda_B)\min(|\lambda_A|, |\lambda_B|) \quad (1)$$

where $\psi^*(\lambda_A)$ and $\psi^*(\lambda_B)$ respectively represent sign of each of LLR A and LLR B, and where $|\lambda_A|$ and $|\lambda_B|$ respectively represent magnitude of each of LLR A and LLR B. A sign $\psi^*(\lambda_A)$ may be defined as 1 for all values of an operand A greater than or equal to 0 and as −1 otherwise (i.e., for all values of an operand less than zero). Likewise, a sign $\psi^*(\lambda_B)$ may be defined as 1 for all values of an operand B greater than or equal to 0 and as −1 otherwise (i.e., for all values of an operand less than zero). Likewise, a G function may be approximated as a min-sum as set forth in Equation (2) as:

$$\lambda_G(\hat{s}, \lambda_A, \lambda_B) \approx \lambda_A(-1) + (\lambda_B) \quad (2)$$

where ŝ is a modulo-2 partial sum of decoded bits.

A below-described decoder processing unit capable of performing such F and G functions for an LLR A and an LLR B has fewer logic layers, such as for a left-to-right data flow, in order to reduce latency and increase throughput. Such a decoder processing unit uses some inputs to create an input vector to a control circuit. Output of such control circuit is used to provide a vector select for selecting an output magnitude.

With the above general understanding borne in mind, various configurations for polar decoding are generally described below.

FIG. 1 is a circuit-block diagram depicting an exemplary portion of a decoder 100. Decoder 100 is for successive cancellation polar code decoding ("SC polar decoding"). Single signal lines are illustratively depicted for purposes of clarity and not limitation, as such signal lines may represent single or parallel signal busses. For example, sign and carry signals may be single bit signals. Select signals may be single or multiple bit signals depending upon application. Operand magnitude, difference, and sum signals may be multiple bit signals. A partial sum signal may be a single bit signal. Decoder 100 may include a network of F/G processing circuits or nodes 199-0 through 199-n ("decoder nodes 199"), for n an integer greater than 0. Along those lines, there may be multiple ranks of decoder nodes 199, such as a butterfly-based topology for example, where input samples are obtained as inputs for an initial rank 198, and where outputs from such initial rank are passed to a next rank, and so on until input into decision circuitry (not shown). For purposes of clarity and not limitation, an a decoder node 199 of an initial rank 198 is described, as such decoder node 199 may be replicated for subsequent ranks of a network of decoder nodes 100. Accordingly, generally only details regarding a decoder node 199 are described below in detail.

Decoder node 199 includes a multiplexer circuit ("multiplexer") 111, a multiplexer 112, a subtractor circuit ("subtractor") 113, an adder circuit ("adder") 114, a subtractor circuit ("subtractor") 115, a multiplexer 117, and a control circuit 120. Decoder node 199 may be configured for polar decoding of operands A and B, where operands A and B are respective log-likelihood ratios expressed in sign-magnitude form.

Absolute value A ("absA") signal 105 may be a magnitude of operand A ("magnitude A"), namely a magnitude of an LLR A. Absolute value B ("absB") signal 106 may be a magnitude of operand B ("magnitude B"), namely a magnitude of an LLR B.

Sign A ("signA") signal 101 may be a sign, such as positive or negative, of operand A, namely a sign of an LLR A. Sign B ("signB") signal 102 may be a sign, such as positive or negative, of operand B, namely a sign of an LLR B.

Sign A signal 101 and sign B signal 102 are inputs to control circuit 120. Control circuit 120 may be configured to include a plurality of lookup tables or LUTs 125, as described below in additional detail. Other inputs to control circuit 120 may include a partial sum ("psum") signal 103, an F/G function select signal ("F/G sel") 104, a subtraction result sign signal ("signD") 116, and an addition result carry ("carry") signal 108. States of signals 101-104, 108, and 116 collectively may provide an input vector 140 to control circuit 120, or more particularly to a lookup table 125, which may include one or more lookup table memories.

Lookup table 125 may have stored therein possible output vectors 126 for possible input vectors 140, where such output vectors 126 may be used as vector selects as described below in additional detail. In another example, lookup table 125 may be replaced with combinatorial logic 201 to provide output vectors 126. However, for purposes of computational efficiency, including less delay, a lookup table 125 may be used.

Subtractor 113 may be configured to directly receive each of an absA signal 105 and an absB signal 106 and may be configured to subtract magnitude B from magnitude A. A result of a subtraction of magnitude B from magnitude A may provide a subtraction result sign signal 116 and a difference signal 121.

Sign signal 116 may be used to indicate if magnitude A is greater than, less than, or equal to magnitude B. Subtraction result sign signal 116 may be positive or negative depending on whether magnitude A is larger or smaller, respectively, than magnitude B. Furthermore, magnitudes A and B can be equal, in which event subtraction result sign signal 116 may be positive.

In polar decoding, operands A and B may represent two frozen bits, two information bits, or an information bit and a frozen bit. Furthermore, for Successive-Cancellation ("SC"), including SC List, polar decoding, processing of encoded bits may be inherently serial, and thus latency and/or throughput may be an issue. Bits in an encoded vector or codeword, which may have been affected by channel noise in a received version of such codeword, processed with SC may go through multiple circuit stages of a conventional decoder. Accordingly, latency and throughput can be a pacing factor in a decoder. Furthermore, in a conventional polar decoder, an LLR calculation may be a limiting circuit with respect to limiting a frequency of operation of such a decoder.

However, for decoder node 199, input vectors 140 may be input in parallel for a bit-serial stream. Other operations of decoder node 199 may be performed in bit-parallel to reduce latency and increase throughput, as described below in additional detail. Furthermore, by additionally having less logic stages in decoder, latency may be reduced and/or throughput may be increased with fewer circuit resources than in a conventional polar code decoder.

A multiplexer 111 may be configured to receive as respective data inputs a fixed masking signal 107 and absB signal 106. Multiplexer 111 may be configured to receive F/G function select signal 104 as a control select input to select either of signals 106 or 107 for output from multiplexer 111. For an F function as indicated by F/G function select signal 104, multiplexer 111 selects a zero value of fixed masking signal 107 for output, as an F function uses an absA value as a possible candidate for an output magnitude. For a G function as indicated by F/G function select signal 104, multiplexer 111 selects absB signal 106 for output, as a G function uses an absB+absA value as a possible candidate for an output magnitude. Fixed masking signal 107 may be set to a logic 0 so as to isolate a magnitude A signal and a magnitude B signal, respectively, for an F function, as possible candidate outputs from multiplexer 117. A logic 0 may be provided such as for example by using an internal or external ground voltage for input.

A multiplexer 112 may be configured to receive fixed masking signal 107 and absA signal 105 as respective data inputs. Multiplexer 112 may be configured to receive F/G function select signal 104 as a control select input to select either of signals 105 or 107 for output from multiplexer 112. For an F function as indicated by F/G function select signal 104, multiplexer 112 selects a zero value of fixed masking signal 107 for output, as an F function uses an absB value as a possible candidate for an output magnitude. For a G function as indicated by F/G function select signal 104, multiplexer 112 selects absA signal 105 for output, as a G function uses an absB-absA value as a possible candidate for an output magnitude. Again, fixed masking signal 107 may be set to a logic 0.

Adder 114 may be configured to receive an absA signal 105 and an output from multiplexer 111, namely either a magnitude value of absB signal 106 or 0. Adder 114 may be configured to add magnitude A and either magnitude B or zero. A result of addition of magnitude A and either magnitude B or zero may be provided by adder 114 as carry signal 108 and a sum signal 122. Carry signal 108 may be used to indicate an overflow or spill condition, as described below in additional detail. Effectively, multiplexer 111 may be used as a masking circuit responsive to state of F/G select signal 104.

A subtractor 115 may be configured to receive as respective data inputs an absB signal 106 and an output from multiplexer 112, namely either a magnitude value of absA signal 105 or 0. Subtractor 115 may be configured to subtract from magnitude B either magnitude A or zero. Subtractor 115 may be configured to provide a result of subtraction of either magnitude A or 0 from magnitude B as a difference signal 123. Effectively, multiplexer 112 may be used as a masking circuit responsive to state of F/G select signal 104.

A control circuit 120, which may include a plurality of lookup table ("LUTs") memories to provide a lookup table 125, may be configured to receive a sign A signal 101, a sign B signal 102, a partial sum signal 103, an F/G function select signal 104, a subtraction result sign signal 116, and an addition result carry signal 108 as an input vector 140. Signals 101-104, 108, and 116 may be a vector input 140. Input vector 140 input to control circuit 120 may be used to generate a corresponding output vector from output vectors 126 stored in lookup table 125. In an example, output vectors 126 may include a one-bit sign bit and a two-bit vector in association with an input vector. Such one-bit sign bit may be for providing an output sign signal 109, and such two-bit vector may be for a vector select signal 118. In another example, output sign signal 109 may be determined in-flight, namely not stored in lookup table 125, by control circuit 120. Such a one-bit sign bit for output sign signal 109 may be determined by an exclusive-ORing of signals.

Control circuit 120 may be configured to select LLRs for SC polar code decoding for an F function and a G function, where one of such functions is selected for use responsive to F/G function select signal 104. Such LLRs may be output as respective output vectors from a lookup table 125. Along those lines, a vector select signal 118 may be an active output vector obtained from output vectors 126 in lookup table 125 responsive to an input vector 140 associated with either an active F function or an active G function, as indicated by F/G function select signal 104 in input vector 140.

In an example, there may be three lookup tables forming lookup table 125, where each of such lookup tables is a 6-input lookup table. Each such lookup table of lookup table 125 may be implemented using field programmably configurable resources of an FPGA or another type of IC with lookup table memory, register memory or RAM for example. For an FPGA example, a lookup table 125 may be programmed responsive to a configuration bitstream with possible vector outputs 126 for vector select signals 118. In an example, such vector outputs 126 may further include a bit field for outputting output sign signal 109. Vector outputs 126 are for possible vector inputs 140 provided via combinations of states of each of single bit signals 101-104, 108, and 116, namely a 6-bit input vector in this example.

Multiplexer 117 may be configured to receive a maximum ("MAX") signal 124, difference signal 121, difference signal 123, and sum signal 122 as respective data inputs as possible output candidates 145. Multiplexer 117 may further be configured to receive vector select signal 118 as a control select input, namely a 2-bit wide signal in this example of a 4-to-1 multiplexer 117, to output as selected one of signals 121-124 as an output absolute value signal 110. Values for signals 121-123 may be determined in parallel.

For a maximum signal 124, a maximum possible LLR value for an application may be provided as a predetermined fixed input. Such a maximum possible LLR value for maximum signal 124 may result due to saturation. Magnitude and sign of an output from decoder node 199 respectively for output absolute value signal 110 and output sign signal 109 may be for a decoded output 150 for operands A and B, where in some instances such decoded output 150 may include a maximum possible LLR value selected from maximum signal 124. Generally, inputs of possible output candidates 145 via signals 121-124 to multiplexer 117 represent probability values. Output of an output absolute value signal 110 and an output sign signal 109 are "soft" values. Soft values are processed throughout a decoder 100 until conventional decision circuitry (not shown; e.g., a "data slicer"), which generally means that there are multiple bits per received sample expressed in sign-magnitude form. In decoder 100, there are separate operations ongoing on sign and magnitude, and sign and magnitude are components of a soft value. Along those lines, soft values are in sign-magnitude form of LLRs for polar decoding, where LLRs are "soft" bits, namely each LLR may be multiple bits.

In a conventional decoder node there may be in part a subtractor logic stage, followed by a multiplexer logic stage, followed by another subtractor (2's complement) logic stage, followed by another multiplexer stage, followed by an adder logic stage, followed by yet another multiplexer stage for polar decoding. In contrast to six stages of logic, including a subtractor followed by both another subtractor and an adder, in a conventional decoder, decoder node 199 has fewer stages and has no add or subtract logic stage followed by another add or subtract logic stage.

In short, decoder node 199 has less logic stages from left-to-right or with respect to serial data flow in order to have less latency and more throughput than a conventional polar code decoder. As polar codes are intended to be used in 5G wireless devices, and as latency and/or throughput may be an issue with respect to quality of result, performance, or service for 5G wireless devices, reducing latency and increasing throughput may be beneficial in such 5G wireless devices. However, decoder 100 may be used for 5G or other wireless devices. Along those lines, decoder nodes 199 of decoder 100 may each use a lookup table 125 to reduce latency and increase throughput by avoiding determining output vectors 126 in flight.

Figures 1, 2:
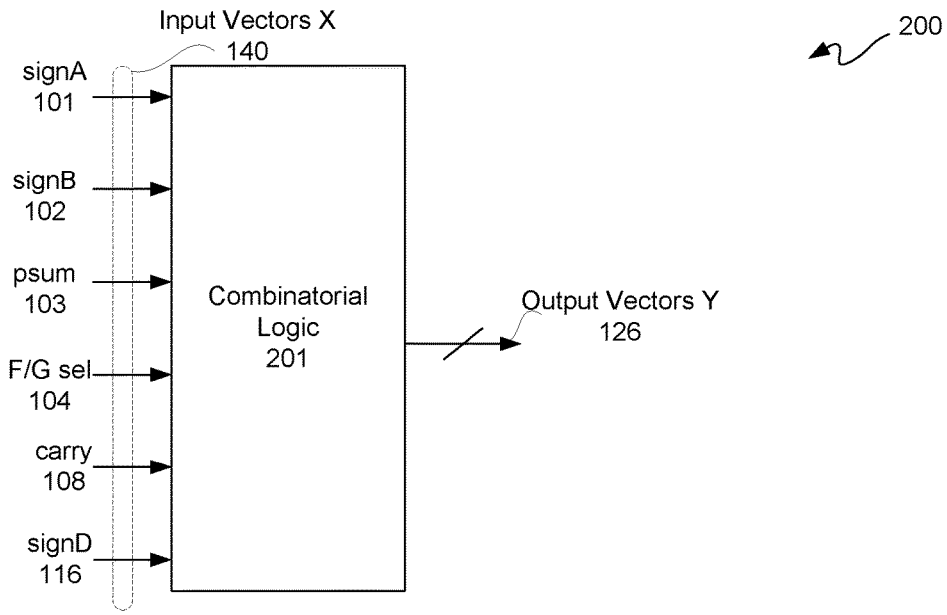
Figure 2:
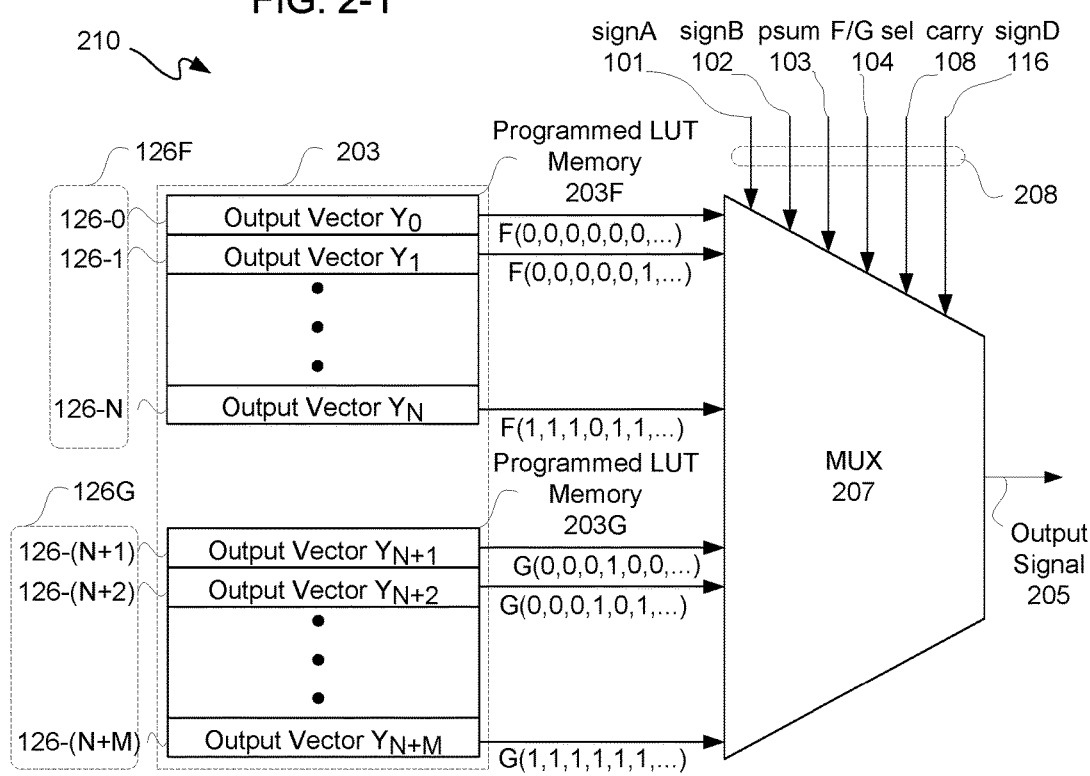

For purposes of clarity by way of example and not limitation, FIG. 2-1 is a block diagram depicting an exemplary output vector generator 200, and FIG. 2-2 is a block-circuit diagram depicting an exemplary lookup table circuit 210. The following description is with simultaneous reference to FIGS. 1 through 2-2.

Responsive to differing possible combinations of states of signals 101-104, 108, and 116, various input vectors (X) 140 may be provided to combinatorial logic 201 to generate corresponding output vectors (Y) 126. Because generating output vectors (Y) 126 on-the-fly may increase latency and reduce throughput, a lookup table memory 203 may be programmed with predetermined output vectors (Y) 126 for possible input vectors (X) 140.

Lookup table memory 203, which may be register memory or RAM for example, may include more than one lookup table memory. In the example of three 6-input lookup tables, three lookup table memories may be used to provide lookup table memory 203, and lookup table memory 203 may be used to provide a lookup table 125.

In this example, as there are two sets of output vectors, namely one set for an F function and another set for a G function, lookup table memory 203 is generally indicated as programmed LUT memory 203F as programmed with F function output vectors ($Y_0$) to ($Y_N$) and programmed LUT memory 203G as programmed with G function output vectors ($Y_{N+1}$) to ($Y_{N+M}$) for N and M positive integers in accordance with possible combinations of states of signals 101-104, 108, and 116, namely for N+M possible input vectors (X) 140 for F and G functions.

Along those lines, an output vector 126-0 may correspond to an F function result for all of states of signals 101-104, 108, and 116 being logic 0, namely F(0,0,0,0,0,0). Likewise, an output vector 126-1 may correspond to an F function result for all of states of signals 101-104, 108, and 116 being logic 0 except for example state of signD signal 116 being a logic 1, namely F(0,0,0,0,0,1). Accordingly, all combinations of states, whether possible or not, for signals 101-104, 108, and 116 to provide output vectors 126-0 through 126-N ("126F"), where output vector 126-N is for all of states of signals 101-104, 108, and 116 being a logic 1 except for example state of F/G select signal 104 being a logic 0, namely F(1,1,1,0,1,1), could be generated. For all of F function output vectors 126-0 through 126-N, F/G select signal 104 is a logic 0 in this example. However, in practicality, not all such possible unique combinations holding F/G select signal 104 to a logic 0 may be needed to map all possible output vectors 126F, namely all possible combinations of states of signals 101-104, 108, and 116, such as described below in additional detail. For example, while partial sum signal 103 may be a logic 0 or a logic 1 for an F function, such partial sum signal 103 bit may be ignored if F/G select signal 104 indicates an F function is selected, as a psum bit is not used in an F function calculation.

Similarly, an output vector 126-(N+1) may correspond to a G function result for all of states of signals 101-104, 108, and 116 being logic 0 except for example state of F/G select signal 104 being a logic 1, namely G(0,0,0,1,0,0). Likewise, an output vector 126-(N+2) may correspond to a G function result for all of states of signals 101-104, 108, and 116 being logic 0 except for example states of signD signal 116 and F/G select signal 104 being a logic 1, namely G(0,0,0,1,0,1). Accordingly, all combinations of states, whether possible or not, for signals 101-104, 108, and 116 to provide output vectors 126-(N+1) through 126-(N+M) ("126G"), where output vector 126-(N+M) is for all of states of signals 101-104, 108, and 116 being a logic 1, namely G(1,1,1,1,1,1), could be generated. For all of G function output vectors 126-(N+1) through 126-(N+M), F/G select signal 104 is a logic 1 in this example. However, in practicality, not all such possible unique combinations holding F/G select signal 104 to a logic 1 may be needed to map all possible output vectors 126G, namely all possible combinations of states of signals 101-104, 108, and 116, such as described below in additional detail.

Multiplexer 207 may be configured to receive signals 101-104, 108, and 116 as a control select signal 208. In other words, states of signals 101-104, 108, and 116 may be provided as a control select input vector signal 208 to multiplexer 207. In another configuration described below in additional detail, carry signal 108 may be replaced with a carry signal 308 of FIG. 3, described below in additional detail. Multiplexer 207 may be configured to receive output vectors 126F and 126G as respective data inputs. Accordingly, an output signal 205 may be selected from among output vectors 126F and 126G in response to a control select input vector signal 208.

Though multiplexer 207 may be a single multiplexer in an example, in another example, such as for a three 6-input lookup table example, multiplexer 207 may include two or more multiplexers, which may be staged in a multiplexer tree. Along those lines, one or more interim multiplexer output signals may be generated to provide output signal 205. In the example of decoder node 199 of FIG. 1, output signal 205 may include bits of vector select signal 118 and output sign signal 109.

Figure 3:
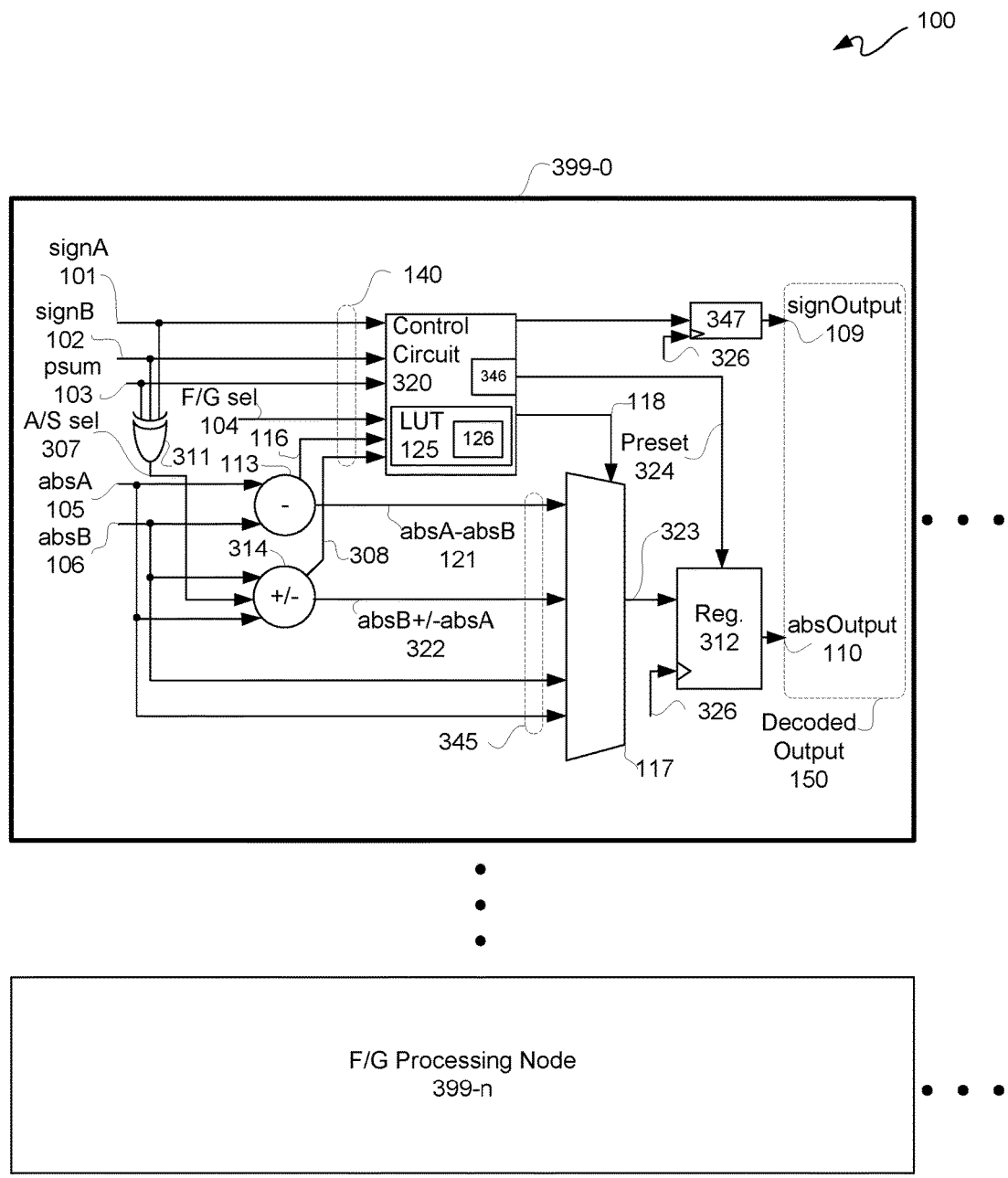
FIG. 3 is a circuit-block diagram depicting another exemplary decoder.

FIG. 3 is a circuit-block diagram depicting an exemplary portion of another decoder 100. Decoder 100 of FIG. 3 may likewise include a network of F/G processing nodes 399-0 through 399-n ("decoder nodes 399"), for n an integer greater than 0, the same as a decoder network for decoder 100 of FIG. 1. For purposes of clarity and not limitation, only details regarding a decoder node 399 are described in detail. Decoder 100 of FIG. 3 may likewise be for SC polar decoding. As decoder node 399 of FIG. 3 is similar to decoder node 199 of FIG. 1, repeat description may be avoided in some instances for purposes of clarity and not limitation.

Decoder node 399 includes an add/subtract select generation circuit 311, a subtractor 113, an adder/subtractor circuit ("adder/subtractor") 314, a multiplexer 117, a control circuit 320, and an output register circuit 312. Output register circuit ("output register") 312 may include multiple registers. Decoder node 399 may be configured for polar decoding of operands A and B, where operands A and B are respective LLRs expressed in sign-magnitude form.

Sign A signal 101 and sign B signal 102 are inputs to control circuit 320. Control circuit 320 includes a lookup table 125. Other inputs to control circuit 320 include a partial sum signal 103, an F/G function select signal 104, signD signal 116, and a carry signal 308.

Control circuit 320 may be configured with a plurality of lookup tables to provide a lookup table 125, as previously described. Control circuit 320 may be configured to receive a sign A signal 101, a sign B signal 102, a partial sum signal 103, an F/G function select signal 104, a subtraction result sign signal 116, and a carry signal 308 as an input vector 140. Signals 101-104, 308, and 116 may be input to control circuit 320 to as an input vector 140, such as for such a plurality of lookup tables forming lookup table 125 for example, for providing a preset signal 324, an output sign signal 109, and a vector select signal 118. In another example, preset signal 324 may be generated in-flight, namely not stored in lookup table 125, as described below in additional detail. Output sign signal 109 may be clocked into register 347 for subsequent clocking out as same responsive to clock signal 326.

Control circuit 320 may be configured to select LLRs for SC polar code decoding for an F function and a G function, where one of such functions is selected for use responsive to F/G function select signal 104. Such LLRs may be output as respective output vectors from lookup tables forming lookup table 125. Along those lines, a vector select signal 118 may be an active output vector select obtained from a lookup table of lookup table 125 responsive to an input vector 140 associated with an active F function or an active G function.

Add/subtract select generation circuit 311, which may be an exclusive-OR circuit ("XOR") 311 or an equivalent Boolean logic circuit, may be configured to receive and exclusively-OR, or modulo-2 combine, respective states of sign A signal 101, sign B signal 102, and partial sum signal 103 to output an add/subtract ("NS") select signal 307. A/S select signal 307 may be provided to an adder/subtractor 314 as a function select signal, namely to configure such adder/subtractor circuit 314 to function either as an adder or a subtractor responsive to A/S select signal 307.

Again, subtractor 113 may be configured to receive an absA signal 105 and an absB signal 106 and to subtract magnitude B from magnitude A. A result of subtraction of magnitude B from magnitude A may provide a subtraction result sign signal 116 and a difference signal 121, as previously described.

Adder/subtractor 314 may be configured to receive A/S select signal 307, absA signal 105, and absB signal 106. In a subtract mode responsive to a subtract state, such as a logic 1 for example output from XOR 311, for A/S select signal 307, adder/subtractor 314 may be configured to subtract magnitude A from magnitude B to provide a difference value for a difference signal for sum/difference signal 322. Because sign signal 116 already indicates relative sizes of absA and absB, carry signal 308 is not used in a subtract mode, namely may be considered in a "don't care" state. In other words, carry signal 308 is still provided to control circuit 320 in a subtract mode; however, control circuit 320 may be configured, such as with another instance of an XOR gate 311, to ignore state of carry signal 308 in a subtract mode. In an add mode responsive to an add state, such as a logic 0 for example output from XOR 311, for A/S select signal 307, adder/subtractor 314 may be configured to add magnitude A to magnitude B to provide a carry value for carry signal 308 and a sum value for a sum signal for sum/difference signal 322.

Multiplexer 117 may be configured to receive an absA signal 105, an absB signal 106, a difference signal 121, and a sum/difference signal 322 as data inputs as possible candidate outputs 345. Multiplexer 117 may be configured to receive vector select signal 118 as a control select input to output a selected value signal 323. Responsive to an active vector select signal 118, multiplexer 117 may be configured to select a selected value signal 323 as between possible candidate outputs 345, namely: magnitude value of an LLR A for absA signal 105; magnitude value of an LLR B for absB signal 106; either a sum value for a sum signal or a difference value for a difference signal for sum/difference signal 322; and a difference value for a subtraction result signD signal 116.

Such a provided selected value signal 323 output from multiplexer 117 may be provided to output register 312. Output register 312 may be configured to receive preset signal 324 and selected value signal 323 to provide an output absolute value signal 110. Output register 312 may include a plurality of registers where each is configured to receive preset signal 324. A selected value signal 323 may be clocked into such registers of output register 312 responsive to clock signal 326 to clock out an output absolute value signal 110. Along those lines, output register 312 may be for pipelining the calculation.

Either or both of decoders 100 and 300, in accordance with the above description, may include one or more of the following enhancements with respect to generation and/or selection of magnitude results over a conventional polar decoder.

An output magnitude value for output absolute value signal 110 can be limited to one of 6 possible values, as follows: absA (first input LLR magnitude), absB (second input LLR magnitude), absA−absB, absB−absA, absA+absB, or MAX (maximum possible LLR magnitude). All of these possible values may be provided to a multiplexer 117 with an output vector select signal 118 for an input vector 140 being selected from a set of predetermined possible output vectors 126 in a lookup table 125.

As only an absA+absB addition operation can result in saturation, only such an add operation for generating a sum signal 122 or 322 need be monitored for an overflow condition. For purposes of clarity by way of non-limiting example, for absA+absB, each being 7 bits, a "top" or most significant (e.g., 8th) bit of an unsigned addition indicates whether or not overflow has occurred by state of such an 8th bit carry signal, and remaining 7 bits of a result of such addition may provide a sum signal. If such a top bit is a logic 0, then overflow may not have occurred. If, however, such a top bit is a logic 1, then overflow may have occurred, and a saturated value may be selected for an output magnitude, namely saturation may be invoked.

An absA-absB subtraction operation provides both a difference as a potential output candidate and a bit to indicate which of absA or absB is the larger or if they are equivalent, namely a sign (or a carry) bit from a result of such an absA-absB subtraction operation. For purposes of clarity by way of non-limiting example, for magnitudes described as 7 bits, if absA has a value of 3 and absB has a value of 7, then absA-absB may result in an 8 bit result of value −4. The "top" bit of this twos complement result, or subtraction, if a logic 1, indicates that absB>absA, namely a negative value or sign, and such 8th bit, namely a top bit or MSB, may be used as a sign signal; for a logic 0 a "top" bit of such subtraction indicates that absB absA, namely a positive value or sign signal. A remaining 7 bits of a result of such a subtraction may be used as difference signal, or more particularly a difference in magnitudes signal.

An absA may be output from absB+absA operation by masking absB to zero. In an FPGA or other circuits with adders, a multiplexer may be absorbed into an adder for no additional resource cost as an adder circuit may include one or more input multiplexers. A select line to such a multiplexer, such as multiplexer 111 for adder 114, may be used to perform this mask. This select line may likewise be with little to no added cost. A select line may be an input bit which selects between an F and a G function, because an F function requires an absA as one possible candidate output of possible candidate outputs 345 and does not require absA+absB as a possible candidate output. However, a G function requires absA+absB as a possible candidate output of possible candidate outputs 345.

In a similar manner, an absB-absA operation can provide absB by effectively masking absA to zero using F/G select signal 104 as a selection input to multiplexer 112 for subtractor 115. In an FPGA or other circuits with subtractors, a multiplexer may be absorbed into a subtractor for no additional resource cost as a subtractor circuit may include one or more input multiplexers. A select line to such a multiplexer, such as multiplexer 112 for subtractor 115, may be used to perform this mask. This select line may likewise be with little to no added cost. A select line may be an input bit which selects between an F and a G function, because an F function may use an absB as one possible candidate output of possible candidate outputs 345 and does not use absB-absA as a possible candidate output. However, a G function may use absB-absA as a possible candidate output of possible candidate outputs 345.

Selection of an output magnitude value from multiplexer 117 may be reduced from the above-described 6 possibilities down to 4 possibilities, as indicated in decoders 100 and 300. Such 4 possible output candidate output magnitude values are: (absA+(0 or absB)), (absB−(0 or absA)), absA−absB, and MAX.

This reduction is significant in modern FPGA architectures, as a 4-to-1 multiplex stage may be performed in a single layer or stage of logic, whereas a 6-to-1 multiplexer stage uses two layers of logic. Propagation delay of each layer of logic and associated connecting routes yield delays which limit the frequency at which a network of decoder nodes 199 or 399 of a decoder 100 circuit can be clocked and therefore affects latency, and possibly throughput, of such a decoder circuit.

For subtraction, if a negative number should result, then such a result may be considered to be implicitly incorrect for an output, because an output magnitude for output absolute value 110 is an unsigned value and hence implicitly a positive result. However, because output vectors 126 may include candidate results for both absA-absB and absB-absA in a list or table of possible candidate results for output, if a negative result occurs, namely a negative value indicated in a sign signal for absA-absB or absB-absA, then an input vector may be used to point to select an alternative or reversed order subtraction result. For example, if a negative sign signal results for absA-absB, then an input vector including such negative sign signal would point to a result for absB-absA, and vice versa. This cross-pointing or cross-linking to an alternate result for a negative sign signal may be used to avoid having to perform a negation on a potential candidate output, namely avoids an additional logic stage associated with such a negation. As described earlier, a negative result may be detected using the top bit or MSB of a subtraction result, namely a sign bit.

Having described how either or both of decoders 100 and 300, in accordance with the above description, may include one or more enhancements with respect to generation and/or selection of magnitude results over a conventional polar decoder, description of enhancements for selection of one of four possible candidate outputs or results, as may be included in either or both of decoders 100 and 300, is described.

Selection of possible candidate outputs may be considered a function of the following inputs: F/G selection input bit, psum input bit, an overflow bit of absA+absB, an underflow bit of absB−absA, sign bit of input A LLR and sign bit of input LLR B. In another implementation, an underflow bit of absA-absB may be used in place of an underflow bit of absB-absA to determine which of magnitudes A or B is greater and in the selection of an output magnitude. Selection of which output candidate of four potential output candidates is a function of 6 single bit values forming an input vector 140. These single bit values, which may be accommodated in a single lookup table of an FPGA, may use two lookup tables of lookup table 125. However, only a vector selected for an F function or a G function is output at a time as a vector select signal 118 as a control select to multiplexer 117, which in this example is a 4-to-1 multiplexer, to generate/select an output magnitude value.

An output sign value for such an output magnitude value may be a function of the same 6 single bit values forming an input vector 140 used to generate/select an output magnitude value. Along those lines, another lookup table of lookup table 125 may be used to accommodate additional bit values and may go along with such other two lookup tables used for selection of a corresponding output magnitude value.

In total, this means that there may be three layers of logic for generation/selection of an output magnitude value and two layers of logic for generation/selection of a corresponding output sign, which sets of layers may be operated in parallel to separately sign and magnitude outputs for a decoded output 150. Effectively, this means that a minimum of three logic layers may be limiting factors in latency and throughput with respect to generation/selection of a magnitude output along with a corresponding output sign. Moreover, this minimum number of three logic layers includes a capability to perform saturation. In contrast, a conventional polar decoder may have a minimum of 4 layers of logic for generation of a magnitude output without capability to perform saturation and may have a minimum of 5 layers of logic for generation of a magnitude output with a capability to perform saturation. An adder, subtractor, and adder/subtractor are all examples of what is termed a "layer of logic" or "logic layer." Along those lines, each of these examples of a "layer of logic" or "logic layer" may contain many gates in sequence. Accordingly, more generally a "layer of logic" or "logic layer" in terms of an IC with programmable configurable logic elements or blocks (e.g., adder, LUTE, 4-1 mux, etc.), such as an FPGA for example, is implemented within a single configurable logic element or block. In this context, such logic layers may be interconnected to one another, such as through programmable interconnects for the example of an FPGA, to provide multiple logic layers.

In comparing decoder node 399 of FIG. 3 to decoder node 199 of FIG. 1, it may be noted that one less subtractor and two fewer multiplexers are used by addition of: an XOR circuit 311; and an output register 312 configured to receive a preset signal 324 from control circuit 320. Input vectors to control circuits 120 and 320 are basically the same, except a carry-only bit for carry signal 108 is provided to control circuit 120, and a carry bit for carry signal 308 is provided to control circuit 320. Additionally, lookup tables 125 may have a same set of output vectors 126 for possible input vectors 140, where addition of a preset value may be provided in-flight, as described below in additional detail.

Furthermore, some different inputs of possible output magnitude candidates 145 and 345 to multiplexer 117 are used as between decoders 100 and 300, respectively. In particular, in decoder node 199, a maximum 124 signal is effectively used for a saturation input; however, in decoder node 399, a maximum 124 signal is not used per se, but a saturation operation may be performed to generate a saturation or maximum value, such as associated with an absA+absB operation. Such a saturation operation involves preset signal 324 provided to preset output register 312, as described below in additional detail.

Accordingly, in comparison to decoder node 199, decoder node 399 further reduces the number of arithmetic operations, and thus the number of adders/subtractors, from 3 to 2. The following description further describes differences between decoders 100 and 300.

In decoder node 399, a reduction of arithmetic operators is provided by combining a subtraction operation, such as for subtractor 115, of two subtraction operations of decoder node 199 operation with an add operation, such as for adder 114, in a form of adder/subtractor 314 in decoder node 399. This reduction involves further selection logic on a control select function input to adder/subtractor 314 to determine its state of operation, namely whether it is to add or subtract. This additional selection logic, which in the example of FIG. 3 is an XOR circuit or gate 311, prevents the inclusion of a selection between an add and a bypass or a subtract and a bypass as used in decoder node 199 with multiplexers 111 and 112. To avoid creating more inputs to each lookup table, namely keeping the number of input bits in input vector 140 to 6, a different set of potential candidate output values for output magnitude may be used in decoder node 399 than used in decoder node 199.

In decoder node 399, potential output magnitude values, namely possible output candidates 345, for input to an output selection multiplexer 117 include: absA−absB, absB+absA or absB−absA, absA, absB. However, to generate a possible output value magnitude MAX, namely a saturation value, lookup table 125 need not be used; however, in another configuration another lookup table may be added to lookup table 125 at the expense of possibly considerably more logic to implement a 5-to-1 multiplexer.

Rather than storing a preset input in lookup table 125, a preset signal 324 may be generated and provided to output register 312. Preset signal 324 may be generated with a carry bit of a carry signal 308 for an add mode of adder/subtractor 314. Such carry bit of carry signal 308 may be passed with bits of signals 101-104 for input to a selection circuit 346 of control circuit 320, where output of selection circuit 346 may be preset signal 324.

Use of selection circuit 346 to preset output register 312 effectively allows a fifth possible output value magnitude candidate to be used whilst still using a 4-to-1 multiplexing by multiplexer 117. However, again in another example, multiplexer 117 of decoder node 399 may be a 5-to-1 multiplexer with a fifth possible output value magnitude candidate of candidates 345, namely optionally maximum signal 124 (shown in FIG. 1).

Accordingly, while decoder node 399 is a reduction in overall logic with respect to decoder node 199, left-to-right data flow logic is not reduced. Moreover, as an output register 312 may be clocked at a high frequency for increased throughput, register 312 may be used for pipelined operation to reduce latency.

Additionally, because a decoder 100 may, for example, include over a hundred, including multiple hundreds, of decoder nodes 199 or 399, use of either of such decoder nodes 199 or 399 may be beneficial due to cumulative effects. However, decoder 100 of FIG. 1 does not involve a register stage in decoder node 199 does decoder 100 of FIG. 3. Decoder 100 of FIG. 1 may be used to reduce serial logic such that fewer registers may be inserted in a pipeline than would otherwise be need to achieve a specified level of performance. However, with decoder 100 of FIG. 1, registers may be added to achieve higher performance for the same number of registers in a conventional polar code decoder. In decoder 100 of FIG. 3, register 312 may have a preset, as is found in many common register primitives, to allow a preceding multiplexer stage to be a 4 input rather than a 5 input multiplexer. This additional input avoided may be significant in FPGA technologies, because the largest logic unit in commonly available FPGAs is a "LUTE", which would not be able to accommodate such an extra input without an additional layer of logic. While many FPGAs use six input LUTs or LUT6s, not all FPGAs uses LUT6s, and the technology described herein is not limited to FPGAs, and more particularly is not limited FPGAs based around LUT6s, as other types of ICs, including other configurations of FPGAs, may benefit from the technology described herein.

Figure 4:
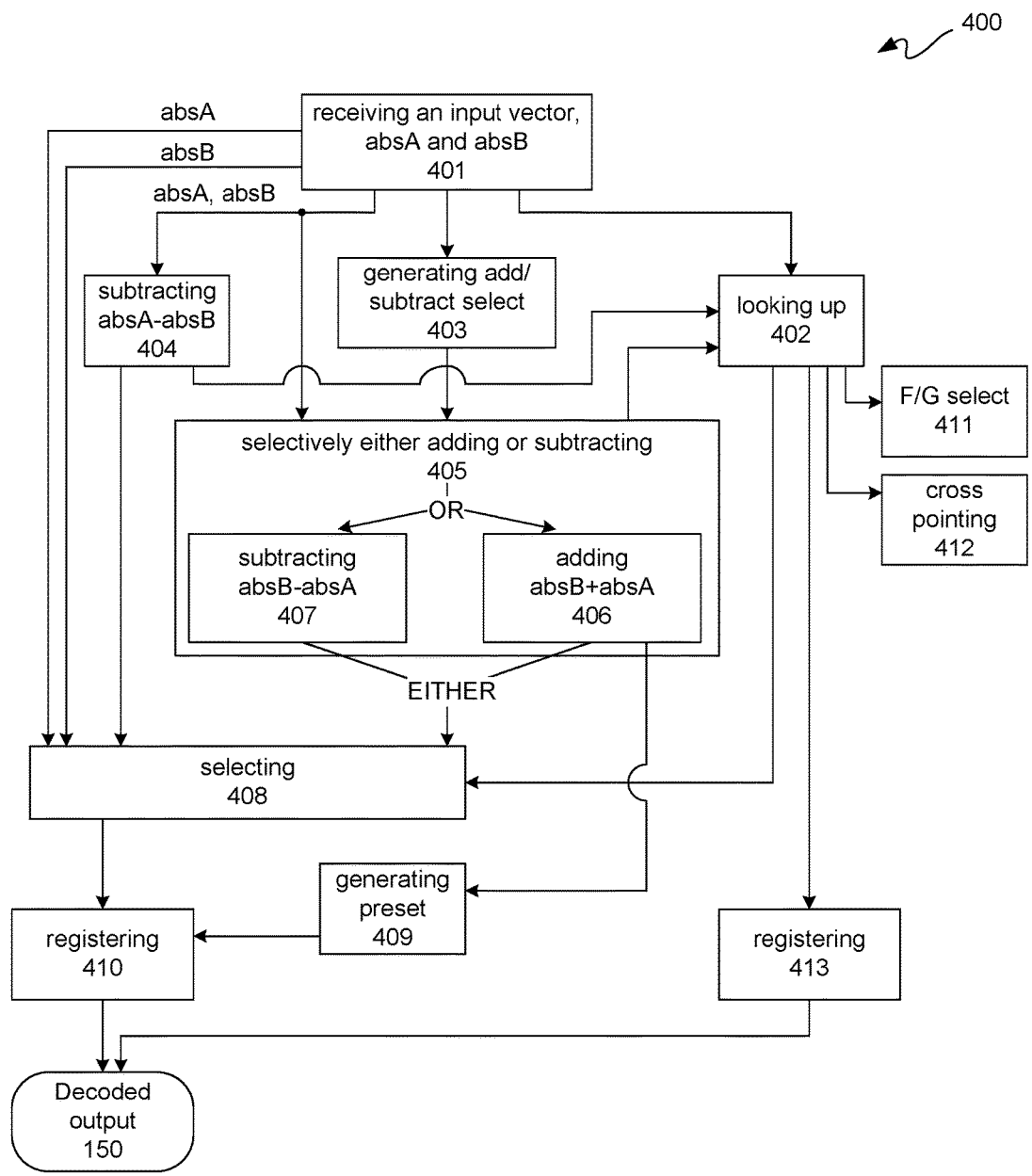
FIG. 4 is a flow diagram depicting an exemplary decoding flow.

FIG. 4 is a flow diagram depicting an exemplary decoding flow 400. Decoding flow 400 may be for decoder node 399 of FIG. 3. However, a decoding flow for decoder node 199 of FIG. 1 may be understood with respect to decoding flow 400. With simultaneous reference to FIGS. 1-4, decoding flow is further described.

At operation 401, an input vector 140, as well as absA and absB signals 105 and 106, respectively, may be received by decoder node 399. More particularly, a control circuit, such as control circuit 320, may receive a signA signal, a signB signal, a partial sum signal, a function select signal, a signD signal, and a carry signal, such as input vector 140 with single bit states respectively of signals 101-104, 116, and 308. XOR circuit 311 may contemporaneously receive signA signal 101, signB signal 102, and partial sum signal 103 at operation 401. Further at operation 401, subtractor 113, adder/subtractor 314, and multiplexer 117 may contemporaneously receive absA and absB signals 105 and 106, respectively.

At operation 402, a lookup in a lookup table circuit, such as lookup table 125, of control circuit 320 may be performed. Such lookup may be used to provide an output sign signal 109 and a vector select signal 118 in response to such input vector 140. Lookup operation 402 is described below in additional detail.

At operation 403, which may be initiated concurrently with operation 401, a select generation circuit, such as XOR circuit 311, may be used to generate an add/subtract select signal 307 in response to signA signal 101, signB signal 102, and partial sum signal 103.

At operation 404, which may be initiated concurrently with operation 401, absA signal 105 may have subtracted therefrom absB signal 106 by a subtractor 113 to provide signD signal 116 and a difference signal 121. Difference signal 121 may be provided for select operation 408, and signD signal 116 may be provided for lookup operation 402.

At operation 405, responsive to state of add/subtract select signal 307, an adder/subtractor 314 may selectively either add to or subtract from absB signal 106 absA signal 105 to provide carry signal 308 and a sum/difference signal 322. In other words, at operation 405 either an add operation 406 for absB+absA or a subtract operation 407 for absB-absA may be performed. Either a sum or a difference is output from operation 405 as sum/difference signal 322 from a selected one of operations 406 or 407 for a select operation at 408, and one of a carry or a sign ("spill") signal is output from operation 405 as a carry signal 308 for a lookup operation at 402.

Returning to lookup operation 402, a look up in a lookup table circuit may be performed responsive to an input vector 140, where such input vector may include a signD signal 116 indicating a negative subtraction result. For example, if signD signal 116 indicates absA is less than absB, a crosspoint operation may be performed at operation 412 for lookup operation 402. In other words, if signD signal 116 is for a negative sign, then rather than looking up for absA-absB, a lookup for absB-absA may be used instead.

At operation 408, a multiplexer 117 may be used to select from absA signal 105, absB signal 106, difference signal 121, and sum/difference signal 322 to provide a selected value signal 323 responsive to vector select signal 118. At select operation 408, an absA signal 105 and an absB signal 106, contemporaneously received at operation 401, may be provided as data inputs to multiplexer 117. A difference signal 121 generated at operation 404 may be received by multiplexer 117 at operation 408. A vector select signal 118 may be received at operation 408 from a lookup operation at 402.

In response to receipt of data inputs and a control select signal 118, at operation 408 a selected value signal 323 may be output from multiplexer 117 as a magnitude hard bit for input LLR operands A and B. Such output from multiplexer 117 may be provided to an output register 312 for a register operation at 410.

At operation 409, a preset signal 324 may be generated. In an example, preset signal 324 may be generated at 409 from signals 101-104 received at operation 401 by control circuit 320, as well as a carry signal 308 generated at operation 406. Operation 409 may be a selection by select circuit 346 of control circuit 320 of such carry signal 308, signA signal 101, signB signal 102, partial sum signal 103, and F/G function select signal 104 to provide preset signal 324.

At operation 410, an output register 312 may be preset with preset signal 324 obtained from operation 409. At operation 410, selected value signal 323 may be registered with output register 312 preset with preset signal 324 to provide an output absolute value signal 110 of a decoded output 150. At operation 413, an output sign signal 109 may be registered, such as by register 347, as obtained from output from lookup operation 402. Output absolute value signal 110 may be provided with associated output sign signal 109, such as from registers 312 and 347, respectively.

Output sign signal 109 and output absolute value signal 110 may be sign and magnitude, respectively, to provide a decoded output 150. Output sign and absolute value may be interim or intermediate values, in the same sign-magnitude form as LLR A and LLB, namely provided as soft values. Such LLR A and LLR B may be from received a polar code encoded message transmitted over a channel, where such encoded message is represented by received states of an LLR A and an LLR B, as channel noise may affect such reception. Such LLRs A and B respectively being in sign and magnitude form, namely signA and absA, and signB and absB, respectively, as previously described for input operands A and B, decoding flow 400 may be for processing LLRs for linear block code decoding, such as for decoding of polar code encoded bits. However, interim or intermediate values of decoder 100, which may be in sign-magnitude form may not have a one-to-one correspondence with input samples LLR A and LLR B. In other words, for clarity, input samples of LLR A and LLR B were described; however, output sign signal 109 and output magnitude signal 110 from a decoder node 199 may be in a sign-magnitude form for next decoder nodes 199, and so on in a decoder 100 up to input to decision circuitry.

Along those lines, at lookup operation 402, input vector 140 may be used, responsive to a function select signal 104 portion thereof, for selecting at operation 411 between an F function set of output vectors and a G function set of output vectors to obtain a vector select signal 118 respectively therefor. Such vector select signal 118 may represent magnitudes of LLRs for Successive Cancellation polar code decoding.

At operation 402, as a result of such a lookup operation, a control circuit 320 may provide a vector select signal 118 as an active output vector for either an F or G function, respectively, responsive to F/G select signal 104.

FIGS. 5-1 through 5-4 is a pseudocode listing depicting an exemplary decoder listing 500. Such pseudocode decoder listing 500 is based on System Verilog in this example; however, decoder 500 may be described in another type of Hardware Description Language ("HDL"), another type of computer language, or other pseudocode in another example. More particularly, System Verilog, C-to-Silicon, SystemC, or another HDL may be synthesized into a netlist, and such netlist may be converted into a configuration bitstream for instantiation in an FPGA.

For purposes of clarity by way of non-limiting example, decoder node listing 500 is an example of a possible implementation of a decoder node 199 of FIG. 1 in programmably configurable resources of an FPGA or other IC. Moreover, decoder node listing 500 may be configured as an ASIC; however, an FPGA implementation of decoder node listing 500 may have sufficient hardware utilization, latency and throughput for decoding SC polar encoded communication via wireless communication channels, such as 5G and other types of wireless communication channels having channel noise.

At lines 501, input and output signal parameters may be defined. Again, operands a and b in this listing, corresponding to operands A and B above, are LLRs in sign-magnitude form. Magnitudes or absolute values are in unsigned form, and so magnitudes are expressed as positive integers. The term "logic" may be used to indicate a signal is a 1-bit signal, unless otherwise defined.

At lines 502, type definitions are listed. Along those lines, a number of bits to represent signed and unsigned LLR values may be defined. Furthermore, a number of bits, including extending magnitudes, to capture a sign change and an overflow condition may be defined.

At lines 503, signal results and other signal parameters may be defined. At lines 504, input LLRs A and B, respectively "a" and "b" in the code listing, may be deconcatenated into sign and magnitude components.

At lines 505, a 4-to-1 multiplexer operation may be defined. In this pseudocode, "PU" is for processing unit, which effectively means a decoder node 199. For example, "PU_ALT_COMB" is for a combinatorial logic process of a decoder node 199. An assign statement may be used to assign a vector of signals to a name, such as control catenation or ctrl_cat in this example. A case statement is to select one of a possible number of values. In this example, ctrl_cat is a 6-bit vector where a greater than b and spill correspond to sign and carry. So there are at most 2^6 combinations, and a case statement may be used to select one of such combinations. In this example, not every possible combination of 2^6 bits is needed to span the set of all realistic vector inputs 140, namely some combinations do not occur in polar decoding for both F and G functions.

In this example, a case statement is to select a matching 6-bit vector following such case statement in either lines 506 or 507. Effectively, in this example, a case statement may be thought of as a 64-to-1 multiplexing statement.

At lines 506, F function 2-bit vector outputs are provided for 6-bit vector inputs, where b indicated binary. In this example, for a top bit a logic 0 of a 6-bit vector input, namely for a top bit being an F/G select signal 104 bit, an F function is selected. Moreover, for a second from a top bit being a psum signal 103 bit, F function vector outputs may be basically divided in half, namely half for a psum bit a logic 0 and another half for a psum bit a logic 1. For a 6-bit input vector 140, a 2-bit vector output may be provided as vector select signal 118. Thus, lines 506 in effect may be for defining an F function portion of lookup table 125. Moreover, for each consecutive pair of lines of F function vectors, the output is the same because psum is not used in the F function. In this example, a first line of an F function table or list, namely, 6'b000000: sgn_mux_sel=2'b00, is to select bits-00 as an output vector select signal 118 to cause absA to be selected by multiplexer 117. Furthermore, in this example, a third line of an F function table or list, namely, 6'b000010: sgn_mux_sel=2'b10, is to select bits-10 as an output vector select signal 118 to cause absB to be selected by multiplexer 117.

Likewise, at lines 507, G function 2-bit vector outputs are provided for 6-bit vector inputs. In this example, for a top bit a logic 1 of a 6-bit vector input, namely for a top bit being an F/G select signal 104 bit, an G function is selected. For, a 6-bit input vector 140, a 2-bit vector output may be provided as vector select signal 119. Moreover, for a second from a top bit being a psum signal 103 bit, G function vector outputs may be basically divided in half, namely half for a psum bit a logic 0 and another half for a psum bit a logic 1. For purposes of clarity by way of example and not limitation, both possible, including saturation, and impossible input vectors 140 are listed. Thus, lines 507 in effect may be for defining a G function portion of lookup table 125.

At lines 508, operation of logic and other circuitry for decoder node 199 may be expressed in terms of operation on signals. In these lines, a starting case statement is for a 4-to-1 multiplexing operation is described. Also in these lines, an output sign signal is described. For example to relate this the decoder node 199, sgnout_alt=a_gtr_b? sgna:sgnb means that output sign signal 109 is set equal to signA signal 101 if A is greater than B, else output sign signal 109 is set equal to signB signal 102. Furthermore, for example, sgnout_alt=a_gtr_b? !sgna:sgnb is basically the same except !sgna means an inverted value of signA signal 101.

FIG. 5-5 is a pseudocode listing depicting an exemplary decoder node listing 550. Such pseudocode decoder node listing 550 is based on System Verilog in this example; however, decoder node listing 550 may be described in another type of Hardware Description Language ("HDL"), another type of computer language, or other pseudocode in another example. More particularly, System Verilog, C-to-Silicon, SystemC, or another HDL may be synthesized into a netlist, and such netlist may be converted into a configuration bitstream for instantiation in an FPGA.

For purposes of clarity by way of non-limiting example, decoder node listing 550 is an example of a possible implementation of a decoder node 399 of FIG. 3 in programmably configurable resources of an FPGA or other IC. In this example, lookup table 125 output vectors 126 are not shown, as such listing in FIGS. 5-2 and 5-3 may likewise be used in decoder node listing 550. Moreover, decoder node listing 550 may be configured as an ASIC; however, an FPGA implementation of decoder node listing 550 may have sufficient hardware utilization, latency and throughput for decoding SC polar encoded communication via wireless communication channels, such as 5G and other types of wireless communication channels having channel noise.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 6:
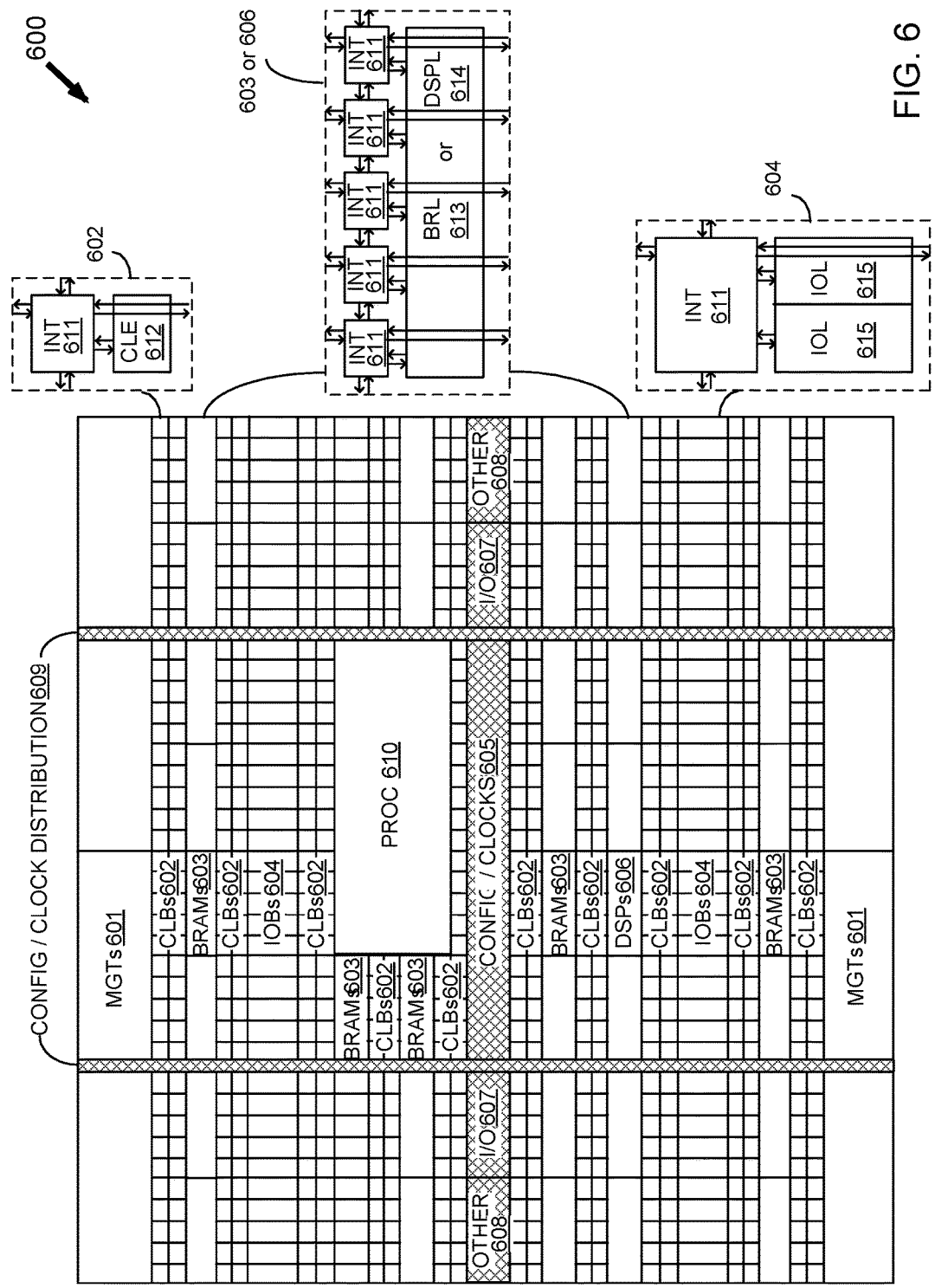
FIG. 6 is a simplified block diagram depicting an exemplary columnar Field Programmable Gate Array ("FPGA") architecture.

As noted above, advanced FPGAs can include several different types of programmable logic blocks in the array. For example, FIG. 6 illustrates an FPGA architecture 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile includes a programmable interconnect element ("INT") 611 having standardized connections to and from a corresponding interconnect element in each adjacent tile. Therefore, the programmable interconnect elements taken together implement the programmable interconnect structure for the illustrated FPGA. The programmable interconnect element 611 also includes the connections to and from the programmable logic element within the same tile, as shown by the examples included at the top of FIG. 6.

For example, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element ("DSPL") 614 in addition to an appropriate number of programmable interconnect elements. An 10B 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured embodiment, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A decoder, comprising:
   a control circuit configured to receive a first sign signal, a second sign signal, a partial sum signal, a function select signal, a third sign signal, and a carry signal as an input vector to provide an output sign signal and a vector select signal;
   a select generation circuit configured to receive the first sign signal, the second sign signal, and the partial sum signal to provide an add/subtract select signal;

a subtractor configured to subtract from a first absolute value signal a second absolute value signal to provide the third sign signal and a difference signal;

responsive to the add/subtract select signal, an adder/subtractor configured to either add or subtract the first absolute value signal to or from the second absolute value signal to provide the carry signal and a sum/difference signal; and a multiplexer configured to select from the first absolute value signal, the second absolute value signal, the difference signal, and the sum/difference signal a selected value signal responsive to the vector select signal.

2. The decoder according to claim 1, wherein the control circuit comprises a lookup table circuit or a combinatorial logic circuit having stored therein output vectors to select therefrom the output sign signal and the vector select signal in response to the input vector.

3. The decoder according to claim 2, further comprising:
the control circuit configured to provide a preset signal responsive to a portion of the input vector and the carry signal; and
an output register configured to receive the preset signal and the selected value signal to provide an output absolute value signal.

4. The decoder according to claim 3, wherein:
the first sign signal and the first absolute value signal are respectively for a first sign and a first magnitude of a first log-likelihood ratio ("LLR");
the second sign signal and the second absolute value signal are respectively for a second sign and a second magnitude of a second LLR;
the function select signal is to select between an F function and a G function for Successive Cancellation polar code decoding; and
the control circuit is configured to provide the vector select signal for either the F function or the G function.

5. The decoder according to claim 4, wherein the difference signal is a first difference signal, and wherein the adder/subtractor responsive to the add/subtract select signal is configured to either:
add the first magnitude to the second magnitude to obtain a sum value for the sum/difference signal and a carry value for the carry signal; or
subtract the first magnitude from the second magnitude to obtain a second difference signal for the sum/difference signal.

6. The decoder according to claim 5, wherein the output sign signal and the output absolute value signal are a decoded output of a polar code encoded input transmitted over a channel represent by the first LLR and the second LLR.

7. The decoder according to claim 5, wherein:
the multiplexer is a 4-to-1 multiplexer of a programmable logic device; and
the input vector is a 6-bit input vector.

8. The decoder according to claim 5, wherein the control circuit includes a selection circuit configured to receive the carry signal, the first sign signal, the second sign signal, the partial sum signal, and the function select signal to provide the preset signal.

9. The decoder according to claim 5, wherein the lookup table circuit is configured to cross-point as between a subset of the output vectors representing subtractions with reversed orders with respect to one another.

10. A method for decoding, comprising:
receiving by a decoder a first sign signal, a second sign signal, a partial sum signal, a function select signal, a third sign signal, and a carry signal as an input vector to a control circuit thereof and a first absolute value signal and a second absolute value signal;
looking up in a lookup table circuit of the control circuit an output sign signal and a vector select signal in response to the input vector;
generating by a select generation circuit an add/subtract select signal in response to the first sign signal, the second sign signal, and the partial sum signal;
subtracting from the first absolute value signal the second absolute value signal by a subtractor to provide the third sign signal and a difference signal;
responsive to the add/subtract select signal, selectively either adding to or subtracting from the first absolute value signal the second absolute value signal by an adder/subtractor to provide the carry signal and a sum/difference signal; and
selecting with a multiplexer from the first absolute value signal, the second absolute value signal, the difference signal, and the sum/difference signal a selected value signal responsive to the vector select signal.

11. The method for decoding according to claim 10, further comprising:
generating a preset signal responsive to a portion of the input vector and the carry signal;
presetting an output register with the preset signal; and
registering with the output register preset the selected value signal to provide an output absolute value signal.

12. The method according to claim 10, wherein:
the first sign signal and the first absolute value signal are respectively for a first sign and a first magnitude of a first log-likelihood ratio ("LLR");
the second sign signal and the second absolute value signal are respectively for a second sign and a second magnitude of a second LLR; and
the looking up comprises:
responsive to the function select signal, selecting between an F function and a G function for Successive Cancellation polar code decoding; and
providing from the control circuit the vector select signal for either the F function or the G function.

13. The method according to claim 12, wherein:
the adder/subtractor responsive to the add/subtract select signal is configured to either add the first magnitude to the second magnitude or subtract the first magnitude from the second magnitude;
the difference signal is a first difference signal;
the adder/subtractor is configured responsive to the add/subtract select signal for either:
adding the second magnitude to the first magnitude to obtain a sum value for the sum/difference signal and a carry value for the carry signal; or
subtracting the first magnitude from the second magnitude to obtain a second difference signal for the sum/difference signal.

* * * * *